(12) United States Patent
Seh et al.

(10) Patent No.: US 7,416,938 B2
(45) Date of Patent: Aug. 26, 2008

(54) INKJET PATTERNING FOR THIN-FILM CAPACITOR FABRICATION, THIN-FILM CAPACITORS FABRICATED THEREBY, AND SYSTEMS CONTAINING SAME

(75) Inventors: Huankiat Seh, Phoenix, AZ (US); Yongki Min, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 11/396,394

(22) Filed: Mar. 31, 2006

(65) Prior Publication Data

US 2007/0242414 A1 Oct. 18, 2007

(51) Int. Cl.
*H01L 21/8242* (2006.01)
(52) U.S. Cl. .......... 438/253; 438/250; 361/301.4; 257/E23.077; 257/E27.116; 257/E29.295
(58) Field of Classification Search ............ 438/250, 438/253; 361/301.4; 257/E23.077, E27.116, 257/E29.295
See application file for complete search history.

(56) References Cited

U.S. PATENT DOCUMENTS

| | | | | |
|---|---|---|---|---|
| 5,132,248 | A * | 7/1992 | Drummond et al. | 505/325 |
| 6,943,485 | B2 * | 9/2005 | Sumi | 310/357 |
| 2003/0183165 | A1 | 10/2003 | Kakimoto et al. | 118/35 |
| 2003/0222943 | A1 * | 12/2003 | Sumi | 347/68 |
| 2005/0194573 | A1 * | 9/2005 | Yamashita | 252/500 |
| 2006/0220167 | A1 * | 10/2006 | Min et al. | 257/499 |
| 2006/0289976 | A1 * | 12/2006 | Min | 257/678 |
| 2007/0010065 | A1 * | 1/2007 | Das et al. | 438/393 |
| 2007/0165359 | A1 * | 7/2007 | Kuwajima et al. | 361/303 |
| 2007/0177331 | A1 * | 8/2007 | Das et al. | 361/306.1 |
| 2007/0200491 | A1 * | 8/2007 | Seo et al. | 313/504 |
| 2007/0200795 | A1 * | 8/2007 | Whitesides et al. | 345/55 |
| 2007/0201124 | A1 * | 8/2007 | Whitesides et al. | 359/296 |
| 2007/0229271 | A1 * | 10/2007 | Shionoiri et al. | 340/572.1 |
| 2007/0242414 | A1 * | 10/2007 | Seh et al. | 361/306.2 |
| 2007/0253144 | A1 * | 11/2007 | Kuwajima | 361/311 |

FOREIGN PATENT DOCUMENTS

| | | |
|---|---|---|
| EP | 1381080 A2 | 1/2004 |
| FR | 2795234 | 12/2000 |
| WO | WO-2007115238 A2 | 10/2007 |
| WO | WO-2007115238 A3 | 10/2007 |

OTHER PUBLICATIONS

"Litrex Homepage", [online]. Litrex Corporation, © 2005. [archived on Oct. 25, 2005]. Retrieved from the Internet: <URL: http://web.archive.org/web/20051025234404/http://www.litrex.com/index.html>, 1 pg.

(Continued)

*Primary Examiner*—Fernando L Toledo
(74) *Attorney, Agent, or Firm*—John N. Greaves (57) ABSTRACT

An integrated thin-film capacitor includes a dielectric disposed between a first electrode and a second electrode. The thin-film capacitor includes a dielectric disposed upon the first electrode, and the dielectric exhibits a substantially uniform heat-altered morphology along a line defined by a characteristic dimension thereof. A computing system is also disclosed that includes the thin-film capacitor.

11 Claims, 8 Drawing Sheets

OTHER PUBLICATIONS

"MicroFab Technologies, Inc.—Fluid Microdispensing for Micro and Nanotechnology Applications", [online]. MicroFab Technologies, Inc., © 2005. [archived on Oct. 25, 2005]. Retrieved from the Internet: <URL: http://web.archive.org/web/20051025055052/http://www.microfab.com>, 1 pg.

Seh, H., et al., "Sol-Gel and Mask Patterning for Thin-Film Capacitor Fabrication, Thin-Film Capacitors Fabricated Thereby, and Systems Containing Same", U.S. Appl. No. 11/396,386, filed Mar. 31, 2006.

Wallace, D., et al., "Think Additive: Ink-Jet Deposition of Materials for MEMS Packaging", *6th Topical Workshop on Packaging of MEMS and Related Micro-Nano-Bio Integrated Systems*, (Nov. 18-20, 2004, Long Beach, CA), (2004), 1-7.

* cited by examiner

INKJET PATTERNING FOR THIN-FILM CAPACITOR FABRICATION, THIN-FILM CAPACITORS FABRICATED THEREBY, AND SYSTEMS CONTAINING SAME

TECHNICAL FIELD

Disclosed embodiments relate to fabrication of a plate capacitor assembly.

BACKGROUND INFORMATION

Power delivery is a significant concern in the design and operation of microelectronic devices. Where the microelectronic device includes a processor die or an application-specific integrated circuit (ASIC) die, an adequate current delivery, a steady voltage, and an acceptable processor transient response are desirable characteristics of the overall microelectronic device package.

A processor die often requires capacitative power sources to respond to transient loads generated during operation. Capacitors are provided to answer the transient load requirements of the die. A thin-film capacitor (TFC) is typically a dielectric disposed between two electrodes, and which was manufactured by etching and laser drilling. Laser drilling is costly, time consuming, and subjects the structures of the TFC to significant uneven heat transients.

During conventional laser-drill processing through a sintered thin-film capacitor (TFC) dielectric layer to form a contact corridor, the extreme heat transient of the laser beam causes a heat-altered region at the cutting edge of the laser drill. The laser-drilled edge is subjected to an extreme heat transient because of the laser-drilling process, but opposite from the cut edge, the sintered TFC dielectric can remain unchanged from the sintering process. The conventional laser-drill process can cause the laser-drilled edge to change physically or chemically compared to the region that is distant from the laser-drilled edge. For example the laser-drilled edge can embrittle in comparison to the region that is distant from the laser-drilled edge. Thus, the heat-altered morphology of the laser-drilled edge can exhibit embrittlement signs caused in a sintered dielectric. The embrittlement can be determined by physical probing among other techniques. The laser-drilled edge can also have changed chemical qualities due to lost or altered materials caused by the extreme heat transient. Thus, the heat-altered morphology of the laser-drilled edge can exhibit chemical depletion signs in a sintered dielectric. The changed chemical qualities can be determined by microscopic techniques such as by scanning electron microscopy (SEM) or ionic-coupled plasma (ICP) analysis. And due to the extreme heat transient of the laser-drilling process, the laser-drilled edge can even have incorporated volatilized stray materials into the matrix of the TFC dielectric in comparison to the distant region. Thus, the heat-altered morphology of the laser-drilled edge can exhibit chemical addition signs in a sintered dielectric. The changed chemical qualities can be determined by microscopic techniques such as by SEM or ICP analysis.

BRIEF DESCRIPTION OF THE DRAWINGS

In order to understand the manner in which embodiments are obtained, a more particular description of various embodiments briefly described above will be rendered by reference to the appended drawings. Understanding that these drawings depict only typical embodiments that are not necessarily drawn to scale and are not therefore to be considered to be limiting of its scope, some embodiments will be described and explained with additional specificity and detail through the use of the accompanying drawings in which.

DETAILED DESCRIPTION

The following description includes terms, such as upper, lower, first, second, etc., that are used for descriptive purposes only and are not to be construed as limiting. The embodiments of a device or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer, and wafers may be made of semiconducting, non-semiconducting, or combinations of semiconducting and non-semiconducting materials. A board is typically a resin-impregnated fiberglass structure that acts as a mounting substrate for the die.

Reference will now be made to the drawings wherein like structures will be provided with like reference designations.

In order to show the structure and process embodiments most clearly, the drawings included herein are diagrammatic representations of embodiments. Thus, the actual appearance of the fabricated structures, for example in a photomicrograph, may appear different while still incorporating the essential structures of embodiments. Moreover, the drawings show only the structures necessary to understand the embodiments. Additional structures known in the art have not been included to maintain the clarity of the drawings.

Figure 1A:
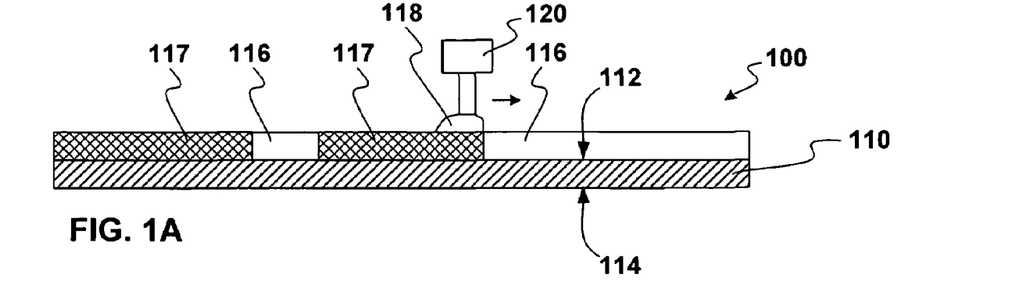
FIG. 1A is a cross-section elevation of a thin-film capacitor assembly during processing according to an embodiment.

FIG. 1A is a cross-section elevation of a thin-film capacitor (TFC) assembly 100 during processing according to an embodiment. The TFC assembly 100 at this processing instant includes a first electrode 110 with an upper surface 112 and a lower surface 114. A dielectric film 116 is disposed upon the upper surface 112 of the first electrode 110. In an embodiment, the dielectric film 116 is a ceramic powder film 116 that is resting upon the upper surface 112. In an embodiment, the ceramic powder film 116 includes a barium-strontium titanate (B ST) powder as a principal presence. "Principal presence" can mean the ceramic powder film 116 is about 100% BST. It can also mean the ceramic powder film 116 is a majority of BST. It can also mean the ceramic powder film 116 is the dielectric material that is less than 50%, but is the most prevalent dielectric material, from about 34% BST to about 49% BST if at least two other dielectrics are present for example. In an embodiment, any other ceramic dielectric is used that is suitable.

Processing of the TFC assembly 100 is depicted by a process of ejecting a fluid 118 in a pattern above the ceramic powder film 116. In an embodiment, the fluid 118 has been ejected from a print head 120. In an embodiment, the print head 120 is an inkjet print head 120.

In an embodiment, the fluid 118 includes a binder for the ceramic powder film 116, which is ejected into a positive pattern. "Positive pattern" is meant that the pattern will remain after further processing and the ceramic powder film 116 in regions were the fluid 118 is not ejected, will be removed. In FIG. 1A, the level of the ceramic powder film 116 that has been infused with the fluid 118 results in an infused ceramic powder film 117.

Figure 1B:
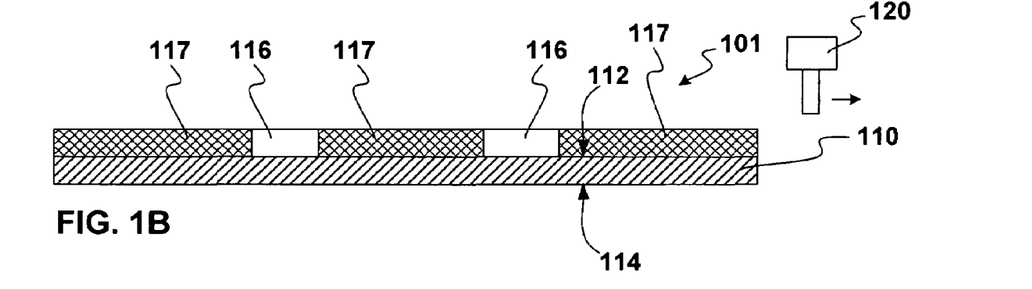
FIG. 1B is a cross-section elevation of the thin-film capacitor assembly depicted in FIG. 1A after further processing according to an embodiment.

FIG. 1B is a cross-section elevation of the thin-film capacitor assembly depicted in FIG. 1A after further processing according to an embodiment. The print head 120 has moved to the right of the first electrode 110. By way of non-limiting example, the TFC assembly 101 in FIG. 1B illustrates the infused ceramic powder film 117 in three regions, and the untreated ceramic powder film 116 in two regions.

In an embodiment, a green high-k dielectric powder film 116 has been formed upon the upper surface 112 of the first electrode 110, followed by the infusion of the fluid 118 into selected regions of the dielectric powder film 116 to form the infused ceramic powder film 117. Thereafter, curing of the fluid 118 is carried out to make the infused ceramic powder film 117 more resistant to removal. After curing, a washing process removes dielectric powder film 116 that was not infused, but the infused ceramic powder film 117 is resistant to removal. In an embodiment, curing is autogenous upon contact of the fluid 118 with the dielectric powder film 116, as the dielectric powder film 116 acts to catalyze the curing process. In an embodiment, curing includes polymerizing of elements within the fluid 118. In an embodiment, the fluid 118 is cured within the infused ceramic powder film 117 by heat treatment.

After removal of the dielectric powder film 116 that was not infused, the TFC assembly 102 is further processed by heating the infused ceramic powder film 117 to achieve a sintering thereof. In an embodiment, curing of the infused ceramic powder film 117 includes at least some oxidation such that it is referred to as at least a calcining process. In an embodiment, the second heating process is properly called annealing instead of sintering. In this embodiment, the infused ceramic powder film 117 is heated such that only fluid loss occurs, and the chemical nature thereof is not materially changed. Because specific applications may use sintering as defined or annealing as defined, for the purposes of disclosed and claimed embodiments, the terms sintering and annealing will be used synonymously.

Figure 1C:
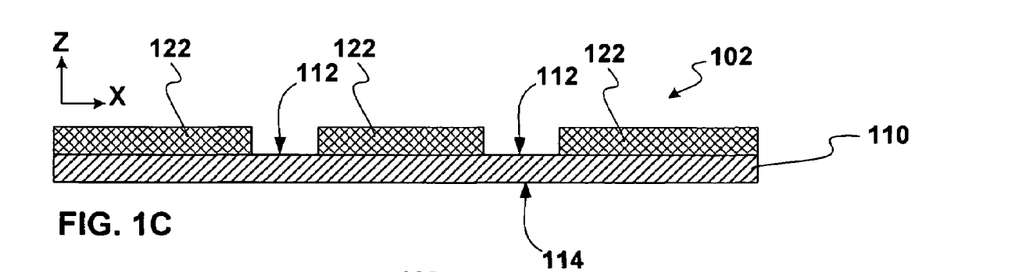
FIG. 1C is a cross-section elevation of the thin-film capacitor assembly depicted in FIG. 1B after further processing according to an embodiment.

FIG. 1C is a cross-section elevation of the thin-film capacitor assembly depicted in FIG. 1B after further processing according to an embodiment. In FIG. 1C, the TFC assembly 102 has been processed to remove the dielectric powder film 116 that was not infused.

In an embodiment, because of the dimensions of the structures in the TFC assemblies of this disclosure, sintering of the infused ceramic powder film 117 achieves a substantially uniform heat-altered morphology of what has become a TFC dielectric layer 122.

During sintering, one parameter to monitor is the internal resistance to heat transfer of the infused ceramic powder film 117, to the external resistance to heat transfer. The Biot modulus, known in heat-transfer technology, is a measure of this parameter. In an embodiment, the internal resistance to heat transfer is minimized by evaluation of the Biot modulus in the Z-direction. Heat curing such as sintering therefore imposes a substantially uniform heat load upon the infused ceramic powder film 117, such that as the TFC dielectric layer 122 is fully sintered, there exists a substantially uniform heat-altered morphology along any characteristic dimension in any direction, particularly in the X- and Y-directions. The Y-direction is into and out of the plane of the FIG.

Figure 1D:
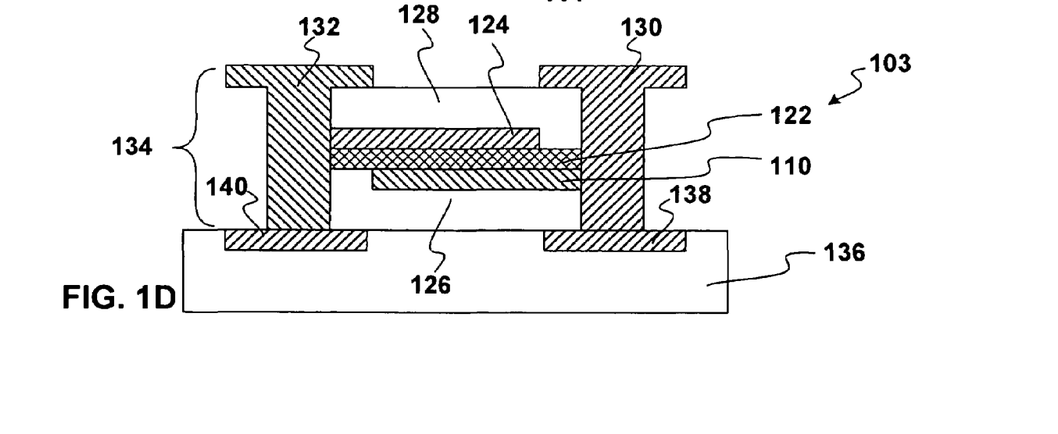
FIG. 1D is a cross-section elevation of the thin-film capacitor assembly depicted in FIG. 1C after further processing according to an embodiment.

FIG. 1D is a cross-section elevation of the thin-film capacitor assembly depicted in FIG. 1C after further processing according to an embodiment. In FIG. 1D, the TFC assembly 103 is depicted schematically. A second electrode 124 has been mated to the TFC dielectric layer 122 and to the first electrode 110. The TFC assembly 103 also includes a lower dielectric layer 126 and an upper dielectric layer 128, which protect the first electrode 110 and the second electrode 124, respectively. Further to the structure of the TFC assembly 103 are a first electrode contact 130 that contacts the first electrode 110, and a second electrode contact 132 that contacts the second electrode 124. The first electrode contact 130 and the second electrode contact 132 are formed in respective contact corridors that can be formed without extreme heat transients, such as laser drilling because the selected regions 116 were removed before sintering.

In an embodiment, the structure 134, as depicted by the lateral intersection of the bracket, is the completed TFC assembly 103. In an embodiment, a mounting substrate 136 is coupled to the structure 134 at a lower electrode bond pad 138 and to an upper electrode bond pad 140. In an embodiment, the TFC assembly 103 is part of an interposer, depicted schematically.

Figure 2A:
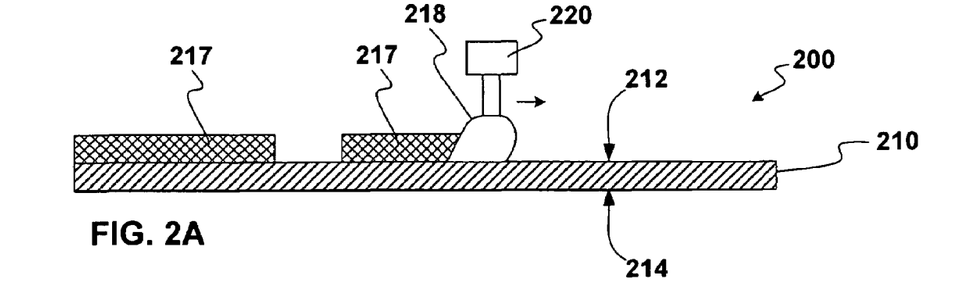
FIG. 2A is a cross-section elevation of a thin-film capacitor assembly during processing according to an embodiment.

FIG. 2A is a cross-section elevation of a thin-film capacitor assembly 200 during processing according to an embodiment. The TFC assembly 200 at this processing instant includes a first electrode 210 with an upper surface 212 and a lower surface 214. A fluid 218, which is a dielectric solution or a dielectric suspension, is being ejected onto the upper surface 212 of the first electrode 210. In an embodiment, the fluid 218 is a suspension of a ceramic powder that includes BST powder as a principal presence. In an embodiment, the ceramic dielectric in the fluid 218 is of such a particulate size that an inkjet printing head 220 is capable of positive patterning upon the upper surface 212 of the first electrode 210. In an embodiment, the print head 220 is an inkjet print head 220. In FIG. 2A, the fluid 218 as ejected, results in green ceramic precursor film 217.

In an embodiment, the green ceramic precursor film 217 is a suspension of ceramic particles. In an embodiment, the green ceramic precursor film 217 is a suspension of BST particles. In an embodiment, the particulate size of the BST powder in the fluid 218 is in a range from about 20 nanometer (nm) to about 300 nm, such that a suspension of the BST powder is ejectable upon the upper surface 212.

In an embodiment, the fluid 218 includes a dielectric-precursor constituent cation solution that has sufficient surface tension to hold a positive pattern upon the upper surface 212 of the first electrode 210 until further processing. In an embodiment, the green ceramic precursor film 217 is a solution of dielectric-precursor constituent cations.

Figure 2B:
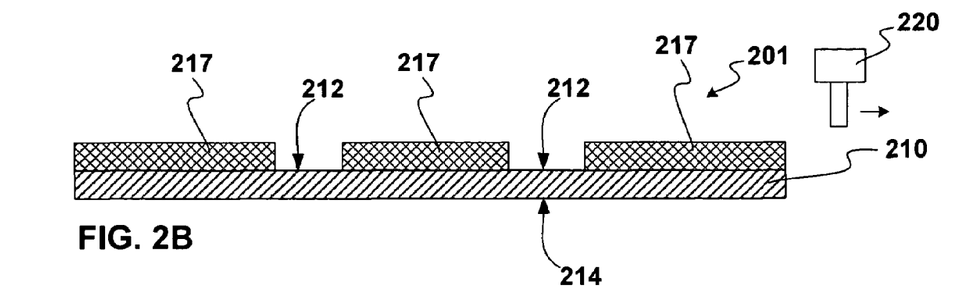
FIG. 2B is a cross-section elevation of the thin-film capacitor assembly depicted in FIG. 2A after further processing according to an embodiment.

FIG. 2B is a cross-section elevation of the thin-film capacitor assembly depicted in FIG. 2A after further processing according to an embodiment. The print head 220 has moved to the extreme right of the first electrode 210.

By way of non-limiting example, the TFC assembly 201 in FIG. 2B illustrates the green ceramic precursor film 217 in three regions, and has left exposed portions of the upper surface 212 in two regions.

In an embodiment, a high-k green ceramic precursor film 217 has been formed upon the upper surface 212 of the first electrode 210. Thereafter, curing of the green ceramic precursor film 217 is carried out to make the green ceramic precursor film 217 more resistant to removal. In an embodiment, curing includes polymerizing of elements within the green ceramic precursor film 217. In an embodiment, the green ceramic precursor film 217 is cured by heat treatment.

Figure 2C:
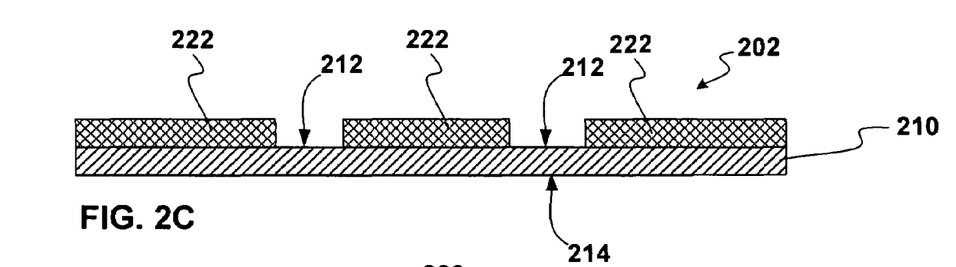
FIG. 2C is a cross-section elevation of the thin-film capacitor assembly depicted in FIG. 2B after further processing according to an embodiment.

FIG. 2C is a cross-section elevation of the thin-film capacitor assembly depicted in FIG. 2B after further processing according to an embodiment. In FIG. 2C, the TFC assembly 202 has been processed to sinter the green ceramic precursor film 217 into a TFC dielectric layer 122 that has a substantially uniform heat-altered morphology.

Figure 2D:
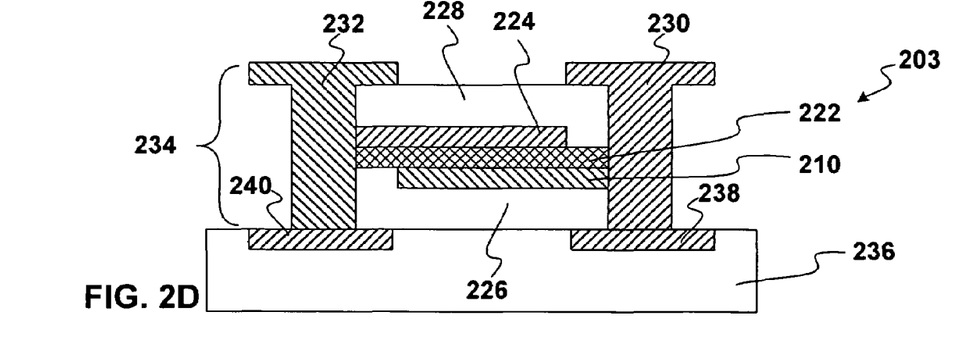
FIG. 2D is a cross-section elevation of the thin-film capacitor assembly depicted in FIG. 2C after further processing according to an embodiment.

FIG. 2D is a cross-section elevation of the thin-film capacitor assembly depicted in FIG. 2C after further processing according to an embodiment. In FIG. 2D, the TFC assembly 203 is depicted schematically. A second electrode 224 has been assembled to the TFC dielectric layer 222 and to the first electrode 210. The TFC assembly 203 also includes a lower dielectric layer 226 and an upper dielectric layer 228, which protect the first electrode 210 and the second electrode 224, respectively. Further to the structure of the TFC assembly 203 are a first electrode contact 230 that contacts the first electrode 210, and a second electrode contact 232 that contacts the second electrode 224. In an embodiment, the structure 234, as depicted by the lateral intersection of the bracket, is the completed TFC assembly 203. In an embodiment, a mounting substrate 236 is coupled to the structure 234 at a lower electrode bond pad 238 and to an upper electrode bond pad 240. In an embodiment, the TFC assembly 203 is part of an interposer, depicted schematically.

Figure 3A:
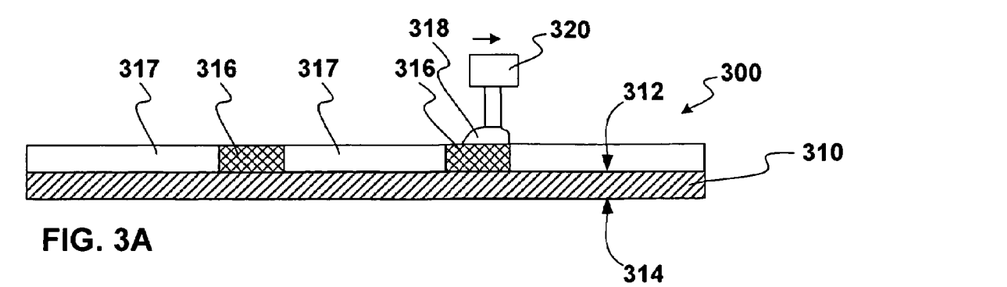
FIG. 3A is a cross-section elevation of a thin-film capacitor assembly during processing according to an embodiment.

FIG. 3A is a cross-section elevation of a thin-film capacitor assembly 300 during processing according to an embodiment. The TFC assembly 300 at this processing instant includes a first electrode 310 with an upper surface 312 and a lower surface 314. A green dielectric film 317 is disposed upon the upper surface 312 of the first electrode 310. In an embodiment, the green dielectric film 317 is a ceramic powder film 317 that is slurried and resting upon the upper surface 312. In an embodiment, the ceramic powder film 317 includes a BST slurry with a BST powder as a principal presence.

Processing of the TFC assembly 300 is depicted by a process of ejecting a fluid 318 in a pattern above the green dielectric film 317. In an embodiment, the fluid 318 has been ejected from a print head 320. In an embodiment, the print head 320 is an inkjet print head 320.

In an embodiment, the fluid 318 includes a binder-weakening agent, also referred to as a network modifier, to destabilize selected areas 316 within the green dielectric film 317. The fluid 318 is ejected into a negative pattern. "Negative pattern" may mean that the pattern will remain, only as an empty region after further processing of the green dielectric film 317. In FIG. 3A, the selected regions 316 of the green dielectric film 317 that have been weakened result in a negative-patterned green dielectric film 317.

Figure 3B:
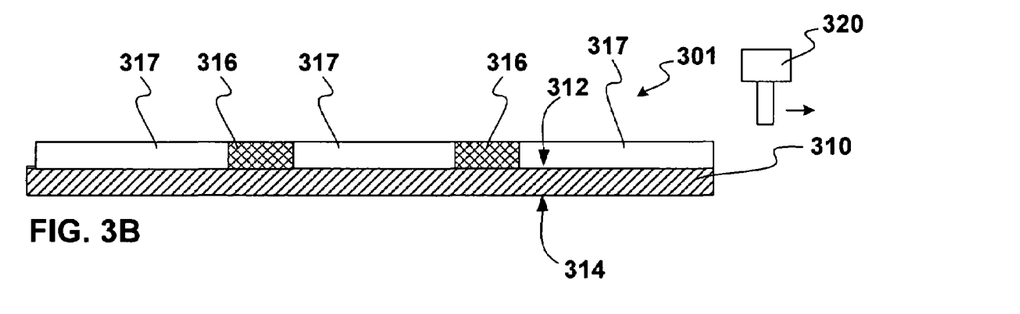
FIG. 3B is a cross-section elevation of the thin-film capacitor assembly depicted in FIG. 3A after further processing according to an embodiment.

FIG. 3B is a cross-section elevation of the thin-film capacitor assembly depicted in FIG. 3A after further processing according to an embodiment. The print head 320 has moved to the extreme right of the first electrode 310. By way of non-limiting example, the TFC assembly 301 in FIG. 3B illustrates the green dielectric film 317 in three regions, and the binder-weakened ceramic powder film 316 in two regions.

In an embodiment, a green high-k dielectric film 317 has been formed upon the upper surface 312 of the first electrode 310, followed by the negative patterning of selected regions 316 to weaken binder therein. Thereafter, curing of the green dielectric film 317 to make the green dielectric film 317 more stable and to remove the selected regions 316 such as by washing. In an embodiment, curing includes polymerizing of elements within the green dielectric film 317. In an embodiment, the green dielectric film 317 is cured by heat treatment.

Figure 3C:
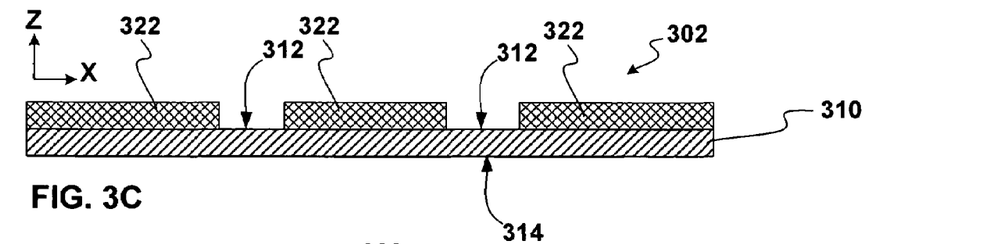
FIG. 3C is a cross-section elevation of the thin-film capacitor assembly depicted in FIG. 3B after further processing according to an embodiment.

FIG. 3C is a cross-section elevation of the thin-film capacitor assembly depicted in FIG. 3B after further processing according to an embodiment. In FIG. 3C, the TFC assembly 302 has been processed to remove the dielectric powder film 316 that was binder-weakened.

After removal of the binder-weakened dielectric powder film 316, the TFC assembly 302 if further processed by heating the green dielectric film 317 to achieve a sintering thereof. In an embodiment, because of the dimensions of the structures in the TFC assemblies of this disclosure, sintering of the green dielectric film 317 achieves a substantially uniform heat-altered morphology of what has become a TFC dielectric layer 322.

Figure 3D:
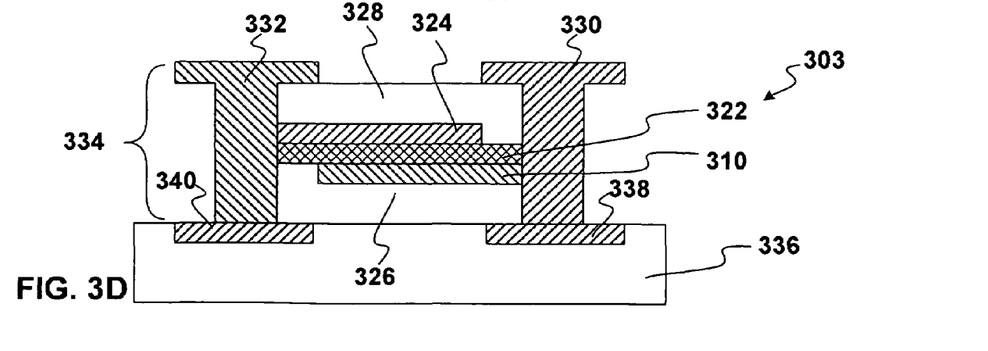
FIG. 3D is a cross-section elevation of the thin-film capacitor assembly depicted in FIG. 3 after further processing according to an embodiment.

FIG. 3D is a cross-section elevation of the thin-film capacitor assembly depicted in FIG. 3 after further processing according to an embodiment. In FIG. 3D, the TFC assembly 303 is depicted schematically. A second electrode 324 has been assembled to the TFC dielectric layer 322 and to the first electrode 310. The TFC assembly 303 also includes a lower dielectric layer 326 and an upper dielectric layer 328, which protect the first electrode 310 and the second electrode 324, respectively. Further to the structure of the TFC assembly 303 are a first electrode contact 330 that contacts the first electrode 310, and a second electrode contact 332 that contacts the second electrode 324. In an embodiment, the structure, as depicted by the lateral intersection of the bracket 334, is the completed TFC assembly 303. In an embodiment, a mounting substrate 336 is coupled to the structure 334 at a lower electrode bond pad 338 and to an upper electrode bond pad 340. In an embodiment, the mounting substrate 336 is an interposer, depicted schematically.

Figure 4:
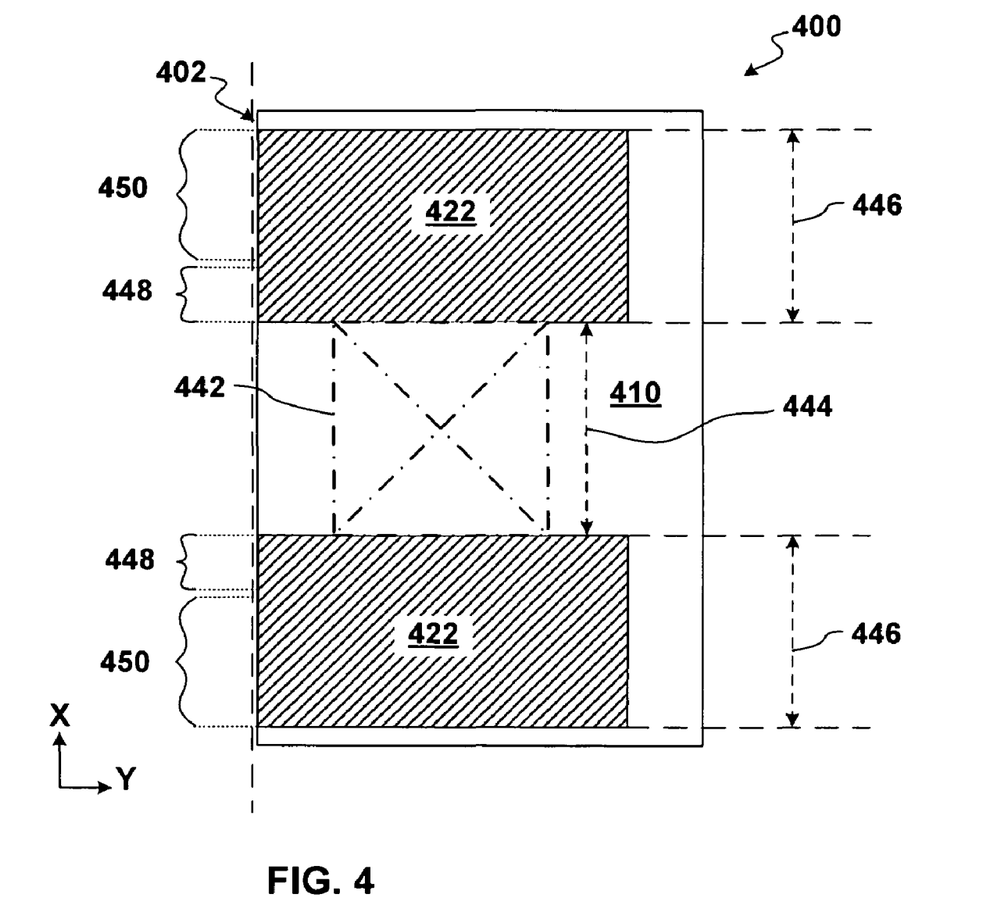
FIG. 4 is a top plan with a cut section, of a thin-film capacitor assembly that has been processed according to an embodiment.

FIG. 4 is a top plan with a cut section 402, of a thin-film capacitor assembly 400 that has been processed according to an embodiment. The TFC assembly 400 is depicted as being "peeled and cut". The TFC assembly 400 includes a first electrode 410 and two occurrences of a TFC dielectric layer 422. The first electrode 410 also shows a contact-corridor footprint 442 that amounts to a spacing dimension 444 that is depicted between the two occurrences of the TFC dielectric layer 422.

A characteristic dimension 446 of the TFC dielectric layer 422 is depicted. In an embodiment to chip-scale packaging of microelectronic dice, the characteristic dimension 446 is in a range from about 100 micrometer (μm) to about 350 μm. In an embodiment, the characteristic dimension 446 is about 200 μm.

During conventional laser-drill processing through a sintered TFC dielectric layer to form a contact corridor, an edge region 448 is heat altered in comparison to a rear region 450 of the TFC dielectric layer 422. The edge region 448 is subjected to an extreme heat transient because of the laser-drilling process, but the rear region 450 has the benefit of both the edge region 448 and the first electrode 410 as heat sinks to resist the extreme heat transient. The conventional laser-drill process can cause the edge region 448 to change compared to the rear region 450. For example the edge region can embrittle in comparison to the rear region 448. The edge region 446 can also have changed chemical qualities due to lost or altered materials caused by the heat transient. And due to the extreme heat transient of the laser-drilling process, the edge region 448 can even have incorporated volatilized stray materials into the matrix of the edge region 448 in comparison to the rear region 450.

According to an embodiment, because sintering of a completed positive pattern, the TFC dielectric layer 422 occurs, and the heat-altered morphology of the TFC dielectric layer 422 is substantially uniform along the direction defined by the characteristic dimension 446. This substantially uniform heat-altered morphology exhibits a known quality of the TFC dielectric layer 422 at any location. Whether it is an edge region 448 or a rear region 448 of the TFC dielectric layer 422, the heat-altered morphology is substantially uniform. In an embodiment, the TFC dielectric layer 422 includes a BST powder as a principal presence.

One parameter to monitor is the ratio of the internal resistance to heat transfer of a green ceramic powder film to the external resistance to heat transfer. The Biot modulus, known in heat-transfer technology, is a measure of this parameter. In an embodiment, the internal resistance to heat transfer is minimized by evaluation of the Biot modulus in the Z-direction. Heat curing, such as sintering only after removing undesired regions therefore imposes a substantially uniform heat load upon the green ceramic powder film, such that as the TFC dielectric layer 422 is fully sintered, there exists a substantially uniform heat-altered morphology along any characteristic dimension in any direction, particularly in the X- and Y-directions The Z-direction in FIG. 4 is into and out of the plane of the FIG.

Figure 5:
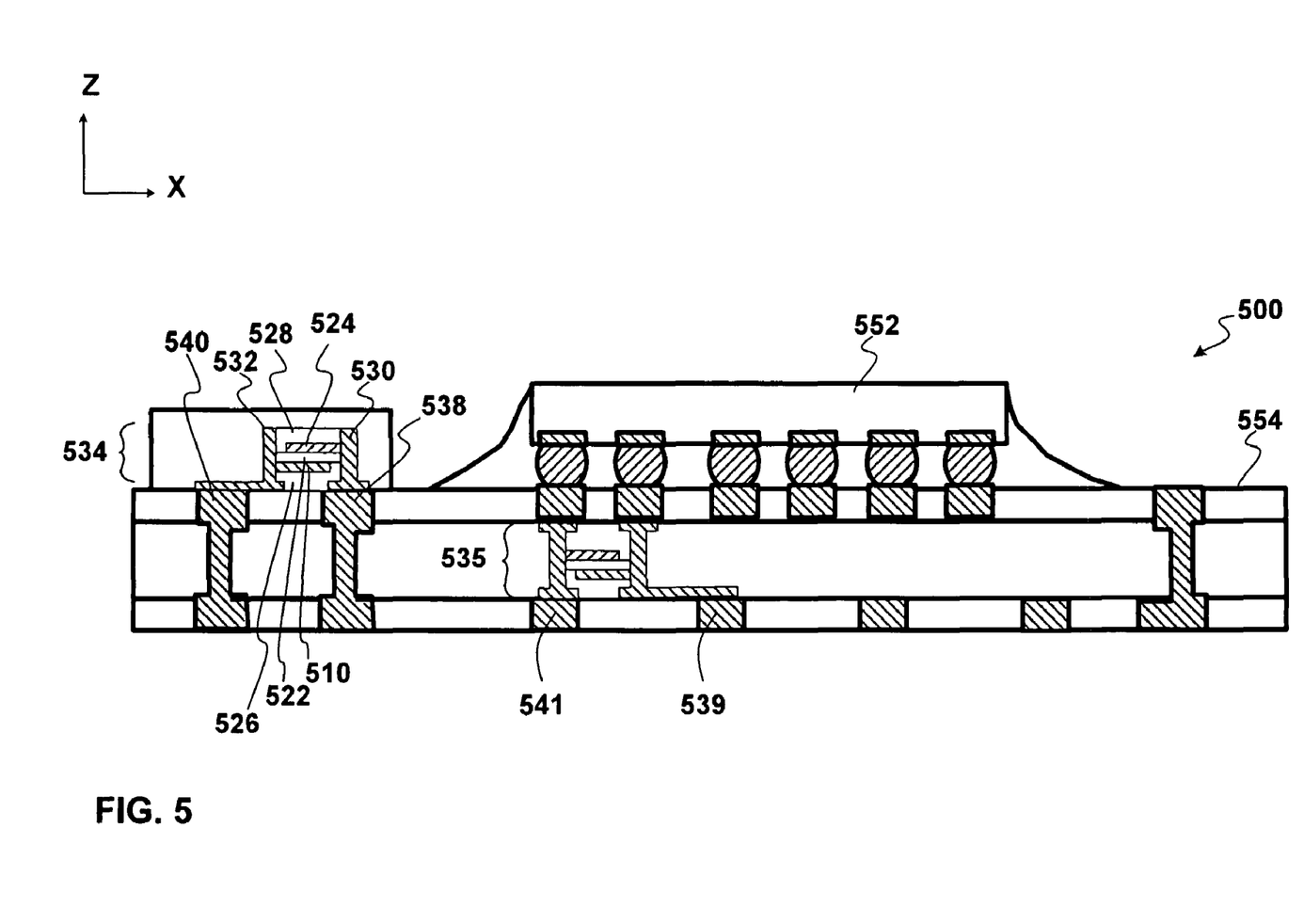
FIG. 5 is a cross-section elevation of a package that includes a thin-film capacitor assembly that was formed according to an embodiment.

FIG. 5 is a cross-section elevation of a package 500 that includes a thin-film capacitor assembly 534 that was formed according to an embodiment. The package 500 includes a die 552 and a mounting substrate 554. Two occurrences of a TFC assembly 534 and 535 are depicted. In an embodiment, a TFC assembly 534 is disposed laterally to the die 552 and upon the mounting substrate 554. In an embodiment, a TFC assembly 535 is disposed below the die 552 and integral to the mounting substrate 554. In an embodiment, the die 552 is not present, but a die site occupies the same space on the mounting substrate 554 that a die can eventually occupy such as die 552, and the TFC assembly 534 is disposed below the die site and is integral to the mounting substrate 554.

The TFC assembly 534 that is disposed laterally to the die 552 is illustrated in greater detail. The TFC assembly 534 includes a first electrode 510 and a second electrode 524, which enclose a TFC dielectric layer 522. In an embodiment, the TFC dielectric layer 522 includes a BST powder as a principal presence. The TFC assembly 534 also includes a lower dielectric layer 526 and an upper dielectric layer 528, which protect the first electrode 510 and the second electrode 524, respectively. Further to the structure of the TFC assembly 534 are a first electrode contact 530 that contacts the first electrode 510, and a second electrode contact 532 that contacts the second electrode 524. The first electrode contact 530 and the second electrode contact 532 are formed in respective contact corridors that can be formed without extreme heat transients, such as laser drilling because the selected regions were removed before sintering. The mounting substrate 554 is coupled to the TFC assembly 534 at a lower electrode bond pad 538 and to an upper electrode bond pad 540.

The TFC assembly 535 that is disposed below the die 552 and that is also integral to the mounting substrate 554 includes a lower electrode bond pad 539 and an upper electrode bond pad 541 that emerge below the mounting substrate 554.

Figure 6:
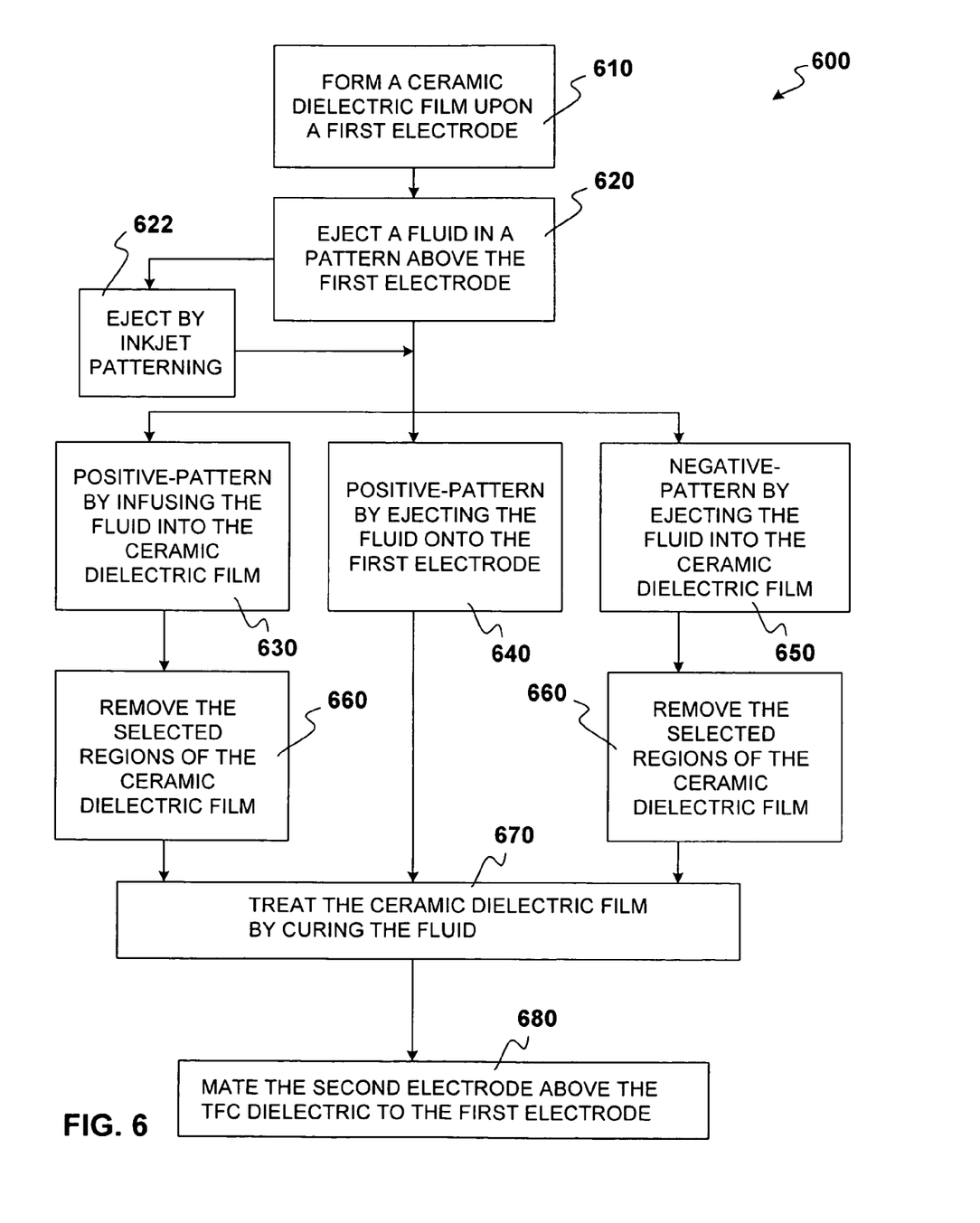
FIG. 6 is a process flow diagram according to various embodiments.

FIG. 6 is a process flow diagram 600 according to various embodiments.

At 610, the process includes forming a ceramic dielectric powder film upon a first electrode. In non-limiting examples, the process at 610 is depicted in FIG. 1A and FIG. 3A as having been accomplished.

At 620, the process includes ejecting a fluid in a pattern above the first electrode. In a first non-limiting example in FIG. 1A, the process illustrates the ejection of a fluid 118 to infuse the dielectric film 116 with a positive patterning.

In a second non-limiting example in FIG. 2A, the process illustrates the fluid 218 ejection of a solution or suspension of dielectric precursors onto the upper surface 212 of the first electrode 210. In an embodiment, the process commences at 620 for the illustrations depicted in FIGS. 2A-2C.

In a third non-limiting example in FIG. 3A, the process illustrates the ejection of a fluid 318 that includes a binder-weakening agent such that a negative patterning is carried out.

At 622, the process includes the alternative limitation that ejection patterning of the fluid is carried out by an inkjet print head. In an embodiment, the inkjet print head is altered to accommodate specific particle sizes that may exceed the disclosed 20 nm to about 300 nm range for the average particle size of the dielectric.

At 630 the fluid ejection technique includes a positive-patterning fluid that infuses the ceramic dielectric film, which is in the form of one of a loose powder and a tacky and porous powder.

At 640, the fluid ejection technique includes a positive patterning fluid that includes one of a solution or suspension of dielectric particle precursors.

At 650, the fluid ejection technique includes a negative-patterning fluid that weakens the polymer or otherwise organic matrix in the dielectric film, which is in the form of a green-stage paste or a slurry.

At 660, the process includes removing unstable selected regions of the ceramic dielectric film. In a non-limiting example related to FIG. 1C, the process includes a wash of the dielectric powder that was left in the negative pattern after the positive patterning of the fluid 118. In a non-limiting example related to FIG. 3C, the process includes a wash of the weakened green-stage paste or slurry that was in the negative pattern formed by the ejection of the fluid 318.

At 670, the process includes heat treating the positive-patterned film. Heat treating is also referred to as treating the fluid to stabilize the positive pattern. In a non-limiting example, the infused ceramic powder film 117 is heat treated under conditions of a sintering process. In a non-limiting example, the green ceramic precursor film 217 is heat treated under conditions of a sintering process. In a non-limiting example, the green dielectric film 317 is heat treated under conditions of a sintering process.

At 680, the process includes mating the first electrode with a second electrode. The mating process achieves a structure with the positive pattern of the dielectric film disposed between the first electrode and the second electrode. In an embodiment, mating of the second electrode to the first electrode precedes the heat-treating process of the sinter.

Figure 7:
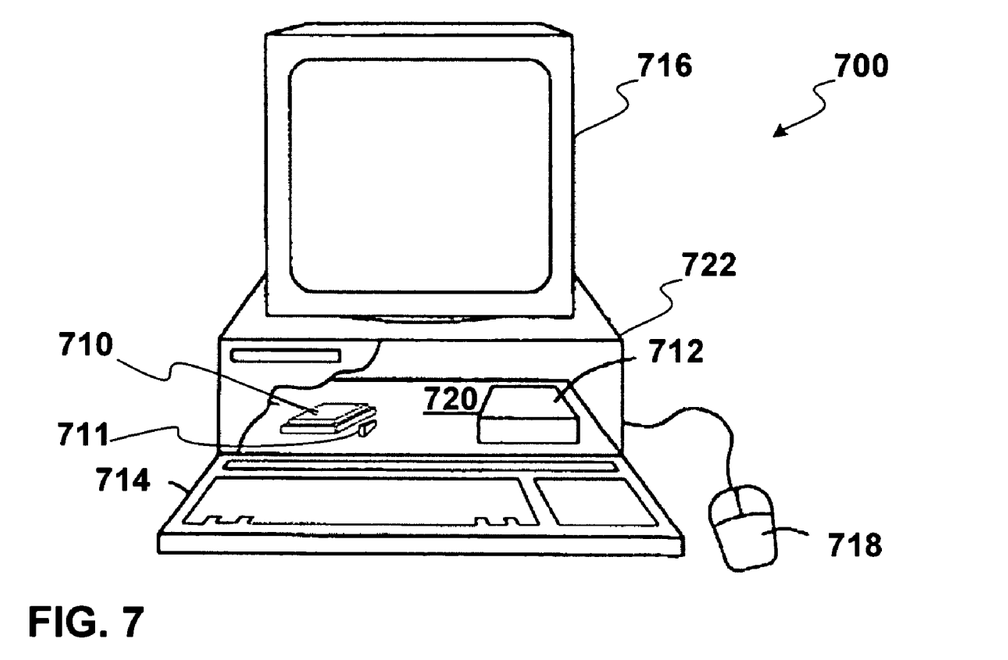
FIG. 7 is a cut-away perspective that depicts a computing system according to an embodiment.

FIG. 7 is a cut-away elevation that depicts a computing system 700 according to an embodiment. One or more of the foregoing embodiments of the thin-film capacitors may be utilized in a computing system, such as a computing system 700 of FIG. 7. Hereinafter any TFC embodiment alone or in combination with any other embodiment may be referred to as an embodiment(s) configuration.

The computing system 700 includes at least one processor (not pictured), which is enclosed in an IC chip package 710. A TFC 711 is depicted mounted next to the chip package 710 upon a board 720. In an embodiment, a TFC is integral to the chip package. In an embodiment, the system 700 also includes a data storage system 712, at least one input device such as a keyboard 714, and at least one output device such as a monitor 716, for example. The computing system 700 includes a processor that processes data signals, and may include, for example, a microprocessor, available from Intel Corporation. In addition to the keyboard 714, the computing system 700 can include another user input device such as a mouse 718, for example. The computing system 700 can include a structure, after processing as depicted in FIGS. 1, 2, 3, and 5 of a TFC dielectric embodiment. In an embodiment, the computing system 700 includes a housing 722 such as the box for a desktop computer.

For purposes of this disclosure, a computing system 700 embodying components in accordance with the claimed subject matter may include any system that utilizes a microelectronic device system, which may include, for example, at least one of the TFC dielectric embodiments that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM (eDRAM) cache on a die. Additionally in an embodiment, the embodiment(s) configuration that is coupled to the processor (not pictured) is part of the system with an embodiment(s) configuration that is coupled to the data storage of the eDRAM cache. Additionally in an embodiment, an embodiment(s) configuration is coupled to the data storage 712, which may be RAM such as DRAM or non-volatile RAM.

In an embodiment, the computing system 700 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on the board 720, which is a TFC dielectric embodiment. In this embodiment, an embodiment(s) configuration is coupled to the DSP, and a separate embodiment(s) configuration may be present that is coupled to the processor in the IC chip package 710. Additionally in an embodiment, an embodiment(s) configuration is coupled to a DSP that is mounted on the same board 720 as the IC chip package 710. It can now be appreciated that the embodiment(s) configuration can be combined as set forth with respect to the computing system 700, in combination with an embodiment(s) configuration as set forth by the various embodiments of the TFC dielectric within this disclosure and their equivalents.

It can now be appreciated that embodiments set forth in this disclosure can be applied to devices and apparatus other than a traditional computer. For example, a die can be packaged with an embodiment(s) configuration, and placed in a portable device such as a wireless communicator or a hand-held device such as a personal data assistant and the like. In this embodiment, the system housing can be a shell for a wireless telephone or the like. Another example is a die that can be packaged with an embodiment(s) configuration and placed in a vehicle such as an automobile, a locomotive, a watercraft, an aircraft, or a spacecraft.

Figure 8:
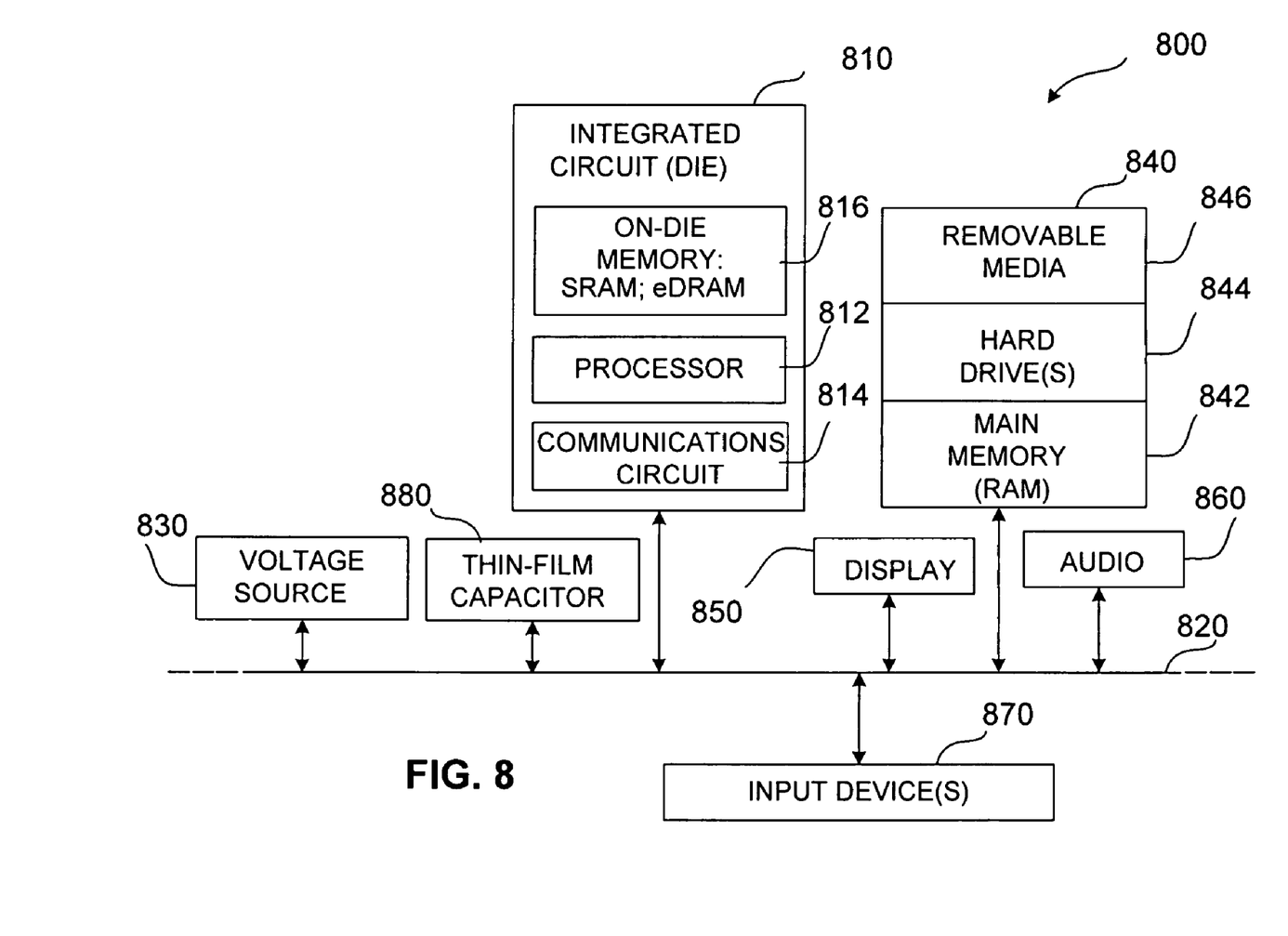
FIG. 8 is a schematic of an electronic system according to an embodiment.

FIG. 8 is a schematic of an electronic system 800 according to an embodiment. The electronic system 800 as depicted can embody the computing system 700 depicted in FIG. 7, but the electronic system is depicted more generically. The electronic system 800 incorporates at least one mounting substrate, for example the board 720 depicted in FIG. 7, with an electronic assembly 810, such as an IC die. In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820. In an embodiment, a TFC assembly 880 is electrically located between the voltage source 830 and the integrated circuit 810. Such location in an embodiment is in a mounting substrate and the TFC assembly 880 is integral to the mounting substrate. Such location of the TFC assembly 880 in an embodiment is upon a mounting substrate that provides a seat for the integrated circuit 810 and the TFC assembly 880, such as a processor and a TFC component, each mounted laterally and adjacent to the other on a board.

The integrated circuit 810 is electrically coupled to the system bus 820 and includes any circuit, or combination of circuits, according to an embodiment. In an embodiment, the integrated circuit 810 includes a processor 812 that can be of any type. As used herein, the processor 812 means any type of circuit such as, but not limited to, a microprocessor, a microcontroller, a graphics processor, a digital signal processor, or another processor. Other types of circuits that can be included in the integrated circuit 810 are a custom circuit or an ASIC, such as a communications circuit 814 for use in wireless devices such as cellular telephones, pagers, portable computers, two-way radios, and similar electronic systems. In an embodiment, the processor 810 includes on-die memory 816 such as SRAM. In an embodiment, the processor 810 includes on-die memory 816 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital video disks (DVDs), flash memory keys, and other removable media known in the art.

In an embodiment, the electronic system 800 also includes a display device 850 or an audio output 860. In an embodiment, the electronic system 800 includes a input device 870, such as a keyboard, mouse, trackball, game controller, microphone, voice-recognition device, or any other device that inputs information into the electronic system 800.

As shown herein, the integrated circuit 810 can be implemented in a number of different embodiments, including an electronic package, an electronic system, a computer system, one or more methods of fabricating an integrated circuit, and one or more methods of fabricating an electronic assembly that includes the integrated circuit mounted on a board and the TFC assembly embodiments as set forth herein in the various embodiments and their art-recognized equivalents. The elements, materials, geometries, dimensions, and sequence of operations can all be varied to suit particular packaging requirements.

In the foregoing Detailed Description, various features may be grouped together in a single embodiment for the purpose of simplifying the disclosure. This method of disclosure is not to be interpreted as reflecting an intention that the claimed embodiments of the disclosure require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of embodiments may be made without departing from the principles and scope of the disclosure as expressed in the subjoined claims.

The Abstract is provided to comply with 37 C.F.R. § 1.72 (b) requiring an abstract that will allow the reader to quickly ascertain the nature and gist of the technical disclosure. It is submitted with the understanding that it will not be used to interpret or limit the scope or meaning of the claims.

What is claimed is:

1. A process comprising:
    ejecting a fluid in a pattern above a first electrode, wherein the pattern is one of a positive pattern and a negative pattern;
    treating the fluid to stabilize the positive pattern or to destabilize the negative pattern; and
    mating the first electrode with a second electrode such that the positive pattern is disposed between the first electrode and the second electrode.

2. The process of claim 1, wherein ejecting the fluid is preceded by forming a ceramic powder film on the first electrode, the process further including:
    polymerizing the fluid in the positive pattern; and
    removing the ceramic powder film that is disposed in the negative pattern.

3. The process of claim 2, wherein ejecting the fluid includes ejecting the fluid over the ceramic powder film, wherein the ceramic powder film has an average particle size range from about 20 nm to about 300 nm.

4. The process of claim 2, wherein ejecting the fluid is carried out by an ink-jet apparatus.

5. The process of claim 1, wherein the fluid is a dielectric solution or suspension, wherein ejecting the fluid achieves a fluid that is ejected into the positive pattern, and wherein treating includes heating the dielectric solution or suspension.

6. The process of claim 5, wherein ejecting includes ejecting a ceramic powder suspension, wherein the ceramic powder suspension has an average particle size range from about 20 nm to about 300 nm.

7. The process of claim 1, wherein the fluid is a dielectric solution or suspension, wherein ejecting the fluid achieves a fluid that is ejected into the positive pattern, and wherein treating includes at least one of calcining and sintering the dielectric solution or suspension.

8. The process of claim 7, wherein ejecting is carried out by an ink-jet apparatus.

9. The process of claim 1, further including:
    forming a ceramic powder film on the first electrode before ejecting the fluid, wherein the fluid is ejected into the negative pattern, the process further including:
    polymerizing the ceramic powder film such that the fluid hinders polymerization in the negative pattern; and
    removing the ceramic powder film that is disposed in the negative pattern.

10. The process of claim 9, wherein ejecting includes ejecting the fluid over the ceramic powder film, wherein the ceramic powder film has an average particle size range from about 20 nm to about 300 nm.

11. The process of claim 10, wherein ejecting is carried out by an ink-jet apparatus.

* * * * *